GRAIN BOUNDARY SEMICONDUCTOR DEVICE AND METHOD

Filed March 18, 1957

WILLIAM SHOCKLEY
INVENTOR.

BY [signature]
ATTORNEYS

United States Patent Office 2,954,307

Patented Sept. 27, 1960

2,954,307

GRAIN BOUNDARY SEMICONDUCTOR DEVICE AND METHOD

William Shockley, 23466 Corta Via, Los Altos, Calif.

Filed Mar. 18, 1957, Ser. No. 646,728

10 Claims. (Cl. 148—1.5)

Figures 1, 2, 3:
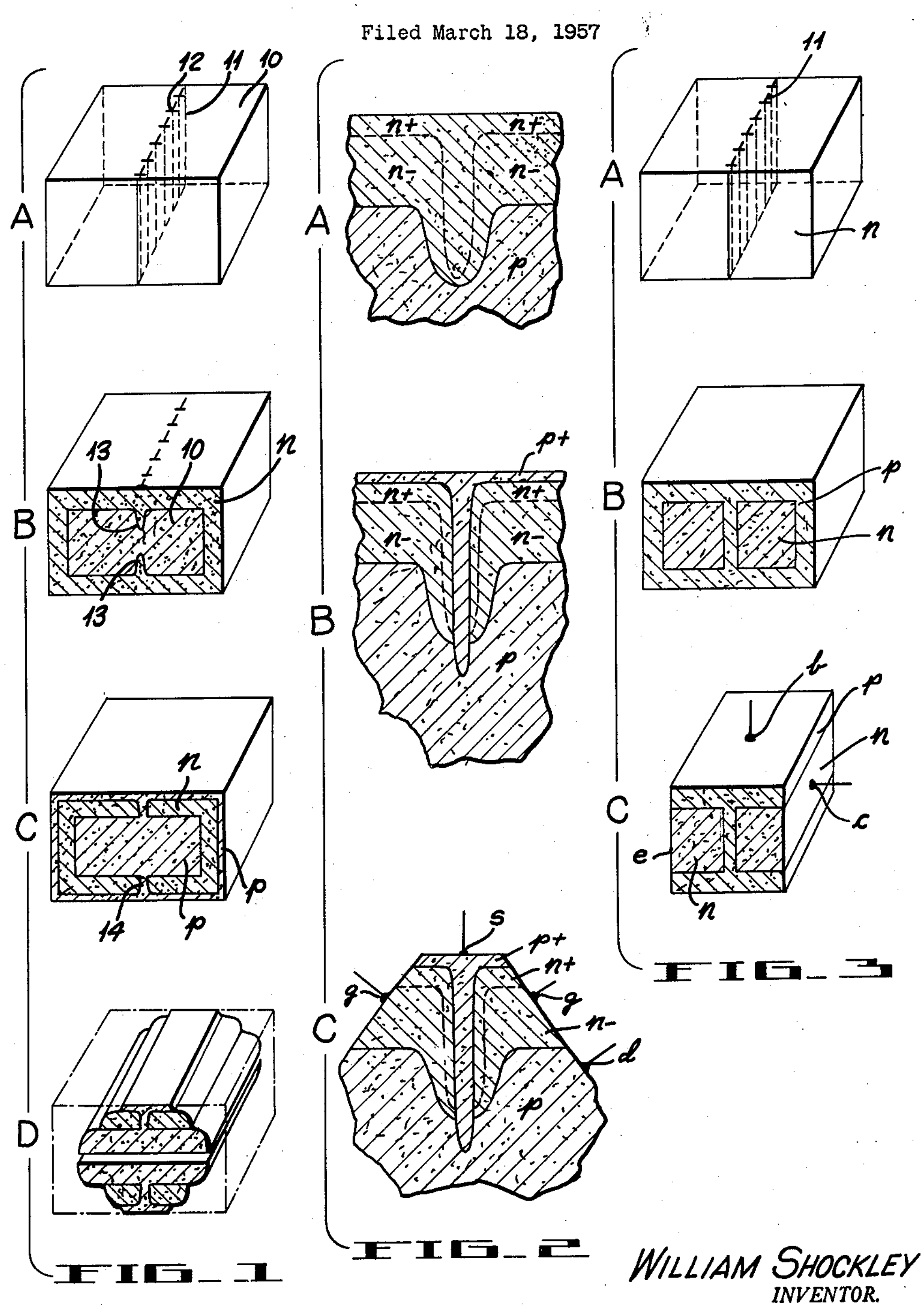

This invention relates generally to grain boundary semiconductor devices and method of making the same.

As semiconductor devices are operated at higher and higher frequencies, it becomes necessary to make devices having certain regions which are relatively thin and often also are relatively short. For example, in junction transistors the thickness of the base layer or region determines the high frequency response. The alpha cut-off frequency becomes higher and higher as the base layer is made thinner and thinner. In field effect transistors, it is important to decrease the thickness and length of the channel whereby the transistor may be operated at relatively high frequencies.

It is an object of the present invention to provide a grain boundary semiconductor device and method of making the same which includes regions having relatively small dimensions.

It is another object of the present invention to provide a junction semiconductor device and method in which regions or layers are formed along grain boundaries.

It is another object of the present invention to provide a junction semiconductor device in which diffusion along grain boundaries is employed to form relatively thin operating regions.

It is another object of the present invention to provide a semiconductor device in which a pair of regions of the same conductivity type are separated by a region of opposite conductivity type formed along a grain boundary.

It is still another object of the present invention to provide a junction semiconductor device in which diffusion into edge dislocations serve to form regions of semiconductor material of one conductivity type in a block of semiconductor material of opposite conductivity type.

These and other objects of the invention will become more fully apparent from the following description when read in conjunction with the accompanying drawing.

Referring to the drawing:

Figures 1A–D are a perspective view showing the steps in forming a grain boundary semiconductor device in accordance with the invention;

Figures 2A–C show the steps in forming another grain boundary semiconductor device in accordance with the invention; and Figures 3A–C show the steps in forming still another grain boundary semiconductor device in accordance with the invention.

As is well known, diffusion in crystals takes place more readily along grain boundaries than it does through the bulk of the crystal. It is believed that this is due to the misfit between atoms on a grain boundary. A degree of looseness in the packing (fitting) together of the atoms at the boundary gives more room for atoms of the diffusing material to move past the atoms which make up the crystal. As a result, the diffusing material penetrates more deeply into the material at grain boundaries.

It has been shown that the ease of diffusion or semiconductive material in grain boundaries is dependent upon the direction in which the diffusion takes place. For example, in a study of the depth of penetration of radioactive zinc diffusing into copper, it was found that diffusion in the grain boundary takes place more easily along directions which correspond to "rods of misfit." For a grain boundary in a crystal in which there is small angular difference between the grains, these "rods of misfit" are edge dislocations.

In all semiconductor material, grain boundaries may be formed in a crystal during the growing process. Crystals having grain boundaries are grown by inserting a pair of crystal seeds disposed adjacent to one another having the proper orientation into the melt. As the seeds are withdrawn, a boundary is formed. If the crystal lattice of the seeds is tilted whereby a small angle exists between the common cube axes, the grown crystal is a bicrystal having edge dislocations. The spacing of the edge dislocations is dependent upon the angle for small angles.

A tilt grain boundary on a p-type crystal is illustrated in Figure 1A. As illustrated, the boundary 11 is substantially perpendicular to the upper and lower faces. The edge dislocations 12 meet the faces of the crystal as indicated. A crystal of the type illustrated may be cut from an ingot containing the grain boundary so that the ends of the dislocations meet the faces of the specimen.

To form a semiconductor device in accordance with the invention, the crystal of Figure 1A is subjected to a diffusion in which impurity atoms (donors) enter the material to produce an n-type layer as shown, Figure 1B. The donors diffuse more readily in the direction of the edge dislocations. Thus, the n-type region or layer penetrates deeper into the crystal at 13.

Subsequent to this diffusion operation, the crystal having the n-type skin, Figure 1B, is subjected to another diffusion. Impurity atoms (acceptors) diffuse into the crystal to form a p-type layer over the n-type layer. If the density of acceptors is relatively high, a high concentration p-type layer is formed on the specimen. Again, the layer diffuses more readily in the directions of the edge dislocations in the grain boundary. Referring to Figure 1C, it is seen that the p-type layer extends along the edge dislocation and compensates the n-type region 13 which has penetrated deeper than the remainder of the n-type layer. A p-type region 14 is formed between the ends of the n-type layer.

The structure is subsequently masked and etched. Contacts are attached and the structure shown in Figure 1D results. In this structure either the upper p-type layer or the lower p-type block may be used for the base connections. The two n-type regions formed by the first diffusion act as the emitter and collector regions of the transistor. The base thickness is extremely small thereby permitting operation at relatively high frequencies without reduction of alpha. Furthermore, the transverse length of the base layer is extremely small thus greatly reducing base resistance and junction capacitance which improves the performance.

The advantages of junction tetrode performance may be realized by making separate connections to the p-type regions at the two ends of the grain boundary.

The structure formed may also be used as a unipolar or field effect transistor. A source contact is made to the upper p-type layer and the drain contact is made to the lower p-type body. With connections made in the foregoing manner, the less abrupt junction between the n-type and p-type material at the base sustains the higher voltage, and because of its gradual concentration gradient is more suitable for the drain contact. The n-type regions are used as gates and serve to widen and narrow the space charge layer in the channel.

When the structure of Figure 1D is employed for a field effect transistor, the capacity at the junction between the drain and gate regions is relatively large, and relatively high gate voltages are required to pinch off the transistor. In Figure 2, an improved grain boundary transistor structure is shown in which low capacity junctions are formed between the drain and gate regions with a high capacity junction along the channel. This permits control of the channel current with relatively low gate voltages.

Referring to Figures 2A–C, enlarged views in the vicinity of the operating regions of a device are shown. The diffusion of the donors into the p-type body and along the grain boundary is performed in two steps. In the first diffusion step a relatively low concentration of donors is employed for a relatively long time thereby forming an n-type layer designated by the symbol n−. Subsequent to this diffusion, a diffusion with a high concentration of donors is carried out for a relatively short time to form the n-type layer designated by the symbol n+. These diffusions give the weak and strong n-type regions represented in Figure 2A.

These diffusions are followed by a diffusion with a high concentration of acceptors. In the case of silicon, the acceptor atoms diffuse more rapidly than the donor atoms so that the acceptors overtake the donors to some degree. As a result, a p+ channel is formed in the n+ region at the grain boundary. The resulting diffusion profile is illustrated in Figure 2B.

Subsequent to the diffusion of acceptors, the device is masked and etched, and contacts are attached. The device illustrated in Figure 2C is formed. As previously described, the advantage of this structure is the low capacity junction between the drain and gate regions and the high capacity junction along the channel.

It is, of course, apparent that by this technique it is possible to make field effect transistors in which the channel length and channel width are extremely small. This is essential for high frequency performance.

Figure 3 illustrates the process of making another junction transistor. A small slice of n-type material is cut from a crystal parallel to the grain boundary 11. The slice is then subjected to a diffusion of acceptors. Diffusion of acceptors along the grain boundary produces a base layer which extends through the material, Figure 3B. The resulting structure is then cut off, etched or otherwise operated upon at the two ends and sliced, etched or otherwise operated upon on the sides to remove a portion of the p-type layer to form a structure of the type shown in Figure 3C. Base contact may then be made to the relatively long base layer at the top or bottom. Emitter and collector contacts are made to the n-type regions as illustrated.

It is to be understood that although specific reference has been made to silicon and to material of a particular conductivity type as the starting block that other semiconductor materials and opposite conductivity types may be employed. It is to be further understood that the drawings are illustrative only and that consequently some of the dimensions have been purposely exaggerated to more clearly illustrate the invention. The invention should, therefore, not be limited in these respects.

I claim:

1. The method of making a grain boundary semiconductor which comprises the steps of forming a semiconductor crystal of one conductivity type having a grain boundary extending to one surface thereof, subjecting the crystal to a diffusion of impurity atoms of one type, said atoms diffusing into said crystal to form a layer of opposite conductivity type on said crystal, said layer extending deep into the crystal at the grain boundary, and subjecting the crystal to a diffusion of impurity atoms of another type, said atoms diffusing into the crystal and forming a layer of the same conductivity type as the original crystal, said layer extending deep into the crystal at the grain boundary to thereby form a region of the same conductivity type separating a pair of regions of opposite conductivity type.

2. The method of making a grain boundary semiconductor device which comprises the steps of forming a semiconductor crystal of one conductivity type having a grain boundary with edge dislocations extending to one surface thereof, subjecting the crystal to a diffusion of impurity atoms of one conductivity type, said atoms diffusing into said crystal to form a layer of opposite conductivity type on said crystal, said layer extending deep into the crystal in the direction of the edge dislocations, and then subjecting the crystal to a diffusion of high concentration impurity atoms of another type, said atoms diffusing into the crystal and forming a layer of the same conductivity type as the original crystal, said layer extending deep into the crystal at the grain boundary and serving to compensate the layer of opposite conductivity type formed in the grain boundary and form a layer of the same conductivity type separating regions of opposite conductivity type.

3. The method of making a grain boundary semiconductor device which comprises the steps of forming a semiconductor crystal of one conductivity type having a grain boundary extending to one surface thereof, subjecting the crystal to a diffusion of impurity atoms of one type, said atoms diffusing into said crystal to form a layer of opposite conductivity type on said crystal, said layer penetrating deeper into the crystal at the grain boundary, subjecting the crystal to another diffusion in the presence of a high concentration of impurity atoms of another type, said atoms diffusing into the crystal and forming a layer of the same conductivity type as the original crystal, said layer penetrating deeper into the crystal at the grain boundary to thereby compensate the region of opposite conductivity type along the grain boundary and form a region of the same conductivity type separating a pair of regions of opposite conductivity type, selectively removing the surface layers formed by diffusion, and making contacts to the various operating regions.

4. The method of making a grain boundary semiconductor device which comprises the steps of forming a semiconductor crystal of one conductivity type having a grain boundary with edge dislocations extending to one surface thereof, subjecting the crystal to a diffusion of low concentration impurity atoms of one type, said atoms diffusing into said crystal to form a layer of opposite conductivity type on said crystal, said layer penetrating deeper into the crystal at the grain boundary, subjecting the crystal to another diffusion of high concentration atoms of said one type to thereby form a layer having greater carrier concentration, said layer extending deeper into the crystal at the grain boundary, and subjecting the crystal to a diffusion of high concentration impurity atoms of another type, said atoms diffusing into the crystal and forming a layer of the same conductivity type as the original crystal, said layer penetrating deeper into the crystal at the grain boundary to thereby form a layer of the same conductivity type separating the pair of regions of opposite conductivity type.

5. The method of making a grain boundary semiconductive device which comprises the steps of forming a semiconductor crystal of one conductivity type having a grain boundary extending to at least one surface thereof, subjecting the crystal to a diffusion of impurity atoms of opposite conductivity type, said atoms diffusing into said crystal to form a layer of opposite conductivity type on at least said one surface of said crystal, and subjecting the crystal to a diffusion of impurity atoms of another type, said atoms diffusing into the crystal and forming a layer of the same conductivity type as the original crystal, said layer extending deeper into the crystal along the grain boundary to form a region of the same conductivity type separating a diffusion region of opposite conductivity type and forming a junction with each separated portion at least along the grain boundary.

6. A grain boundary semiconductor device comprising a body of semiconductor material of one conductivity type having a grain boundary therein extending to at least one surface of the body, a diffusion region of opposite conductivity type diffused on said one surface of said body and forming a junction therewith, and a diffusion region of the same conductivity type separating said region into two portions along the grain boundary and forming a junction with each of said separated portions.

7. A grain boundary semiconductor device comprising a body of semiconductor material of one conductivity type having a grain boundary therein, first and second diffusion regions of opposite conductivity type formed on one surface of said body and extending deeper into said body in the region of the grain boundary, said first and second regions having different carrier concentrations, and a diffusion region of the same conductivity type as the body separating said regions and formed along the grain boundary.

8. A grain boundary semiconductive device comprising a body of semiconductive material of one conductivity type having a grain boundary therein, a first diffusion region of opposite conductivity type formed on one surface of said body and extending deeper into said body in the region of the grain boundary, a second diffusion region of the same conductivity type as the body and separating said first region formed along the grain boundary.

9. A grain boundary semiconductive device comprising a body of semiconductive material of one conductivity type having a grain boundary therein extending to at least one surface of the body, a first diffusion region of opposite conductivity type diffused on said one surface of said body and forming a junction with said body, a second diffusion region of the same conductivity type as the body diffused along said grain boundary and separating the first diffusion region into two portions, said second diffusion region forming a junction with each of said separated portions and providing a base region which is extremely thin and short.

10. A semiconductive device comprising a body of semiconductor material of one conductivity type having a grain boundary therein extending to at least one surface of the body, a first diffusion region of opposite conductivity type formed on at least a part of said surface of said body on both sides of the grain boundary and forming a junction therewith, a second diffusion region of the same conductivity type as the body formed by diffusion from said surface along the grain boundary to separate the first diffusion region into two portions and forming junctions with the separated portion of the first region at least along the grain boundary.

References Cited in the file of this patent

UNITED STATES PATENTS

| | | |
|---|---|---|
| 2,701,326 | Pfann | Feb. 1, 1955 |
| 2,793,145 | Clarke | May 21, 1957 |
| 2,795,742 | Pfann | June 11, 1957 |

OTHER REFERENCES

Metallurgical Abstracts, vol. 21, 1953–54, pages 238 and 444, published by "The Institute of Metals."